US012610823B2

(12) United States Patent
Cobb et al.

(10) Patent No.: US 12,610,823 B2
(45) Date of Patent: Apr. 21, 2026

(54) FLEXIBLE ELECTRONIC CIRCUITS WITH SUPPORT STRUCTURES

(71) Applicant: PRAGMATIC SEMICONDUCTOR LIMITED, Cambridge (GB)

(72) Inventors: Brian Cobb, Sedgefield (GB); Laurence Scullion, Sedgefield (GB); Richard Price, Sedgefield (GB)

(73) Assignee: PRAGMATIC SEMICONDUCTOR LIMITED, Cambridge (GB)

( * ) Notice: Subject to any disclaimer, the term of this patent is extended or adjusted under 35 U.S.C. 154(b) by 376 days.

(21) Appl. No.: 18/037,486

(22) PCT Filed: Nov. 24, 2021

(86) PCT No.: PCT/GB2021/053034
§ 371 (c)(1),
(2) Date: May 17, 2023

(87) PCT Pub. No.: WO2022/112749
PCT Pub. Date: Jun. 2, 2022

(65) Prior Publication Data
US 2024/0014148 A1 Jan. 11, 2024

(30) Foreign Application Priority Data
Nov. 25, 2020 (GB) ..................................... 2018551

(51) Int. Cl.
*H01L 23/00* (2006.01)
*H01L 23/50* (2006.01)
*H01Q 1/22* (2006.01)

(52) U.S. Cl.
CPC ............ *H01L 23/562* (2013.01); *H01L 23/50* (2013.01); *H01Q 1/2283* (2013.01)

(58) Field of Classification Search
None
See application file for complete search history.

(56) References Cited

U.S. PATENT DOCUMENTS

| | | | |
|---|---|---|---|
| 5,804,882 A | 9/1998 | Tsukagoshi et al. | |
| 10,178,769 B2 | 1/2019 | Min et al. | |

(Continued)

FOREIGN PATENT DOCUMENTS

| | | |
|---|---|---|
| GB | 2584106 A | 11/2020 |
| JP | 2003-069181 A | 3/2003 |

(Continued)

OTHER PUBLICATIONS

Hassan, Mahadi-Ul et al. "Assembly and Embedding of Ultra-thin Chips in Polymers" 2013 European Microelectronics Packaging Conference (EMPC), IMAPS, Sep. 9, 2013.

(Continued)

*Primary Examiner* — Bo B Jang
(74) *Attorney, Agent, or Firm* — Jason H Vick; Amped IP LLC

(57) ABSTRACT

A flexible electronic structure for bonding with an external circuit. The flexible electronic structure comprising a flexible body having a first surface, the flexible body comprising at least one electronic component, at least one contact element configured to bond with the external circuit, the at least one contact element operatively coupled with the at least one electronic component and provided at the first surface of the flexible body, and arranged to operably interface with the external circuit after bonding, and at least one support element provided at the first surface of the flexible body, each support element including a contact area arranged to contact a first surface of an external structure comprising the external circuit or a corresponding surface element disposed on the first surface of the external structure, wherein the contact area of each of the at least one support element does not overlie one or more predetermined types of electronic component among the at least one (Continued)

electronic component or one or more predetermined types of element of the at least one electronic component.

20 Claims, 8 Drawing Sheets

(56)                    References Cited

U.S. PATENT DOCUMENTS

| | | |
|---|---|---|
| 2013/0016289 A1 | 1/2013 | Hayashiyama et al. |
| 2015/0077949 A1 | 3/2015 | Baek et al. |
| 2015/0163918 A1 | 6/2015 | Baba et al. |
| 2017/0034900 A1 | 2/2017 | Strader |
| 2018/0063956 A1 | 3/2018 | Min et al. |
| 2018/0219272 A1 | 8/2018 | Baheti et al. |
| 2020/0083591 A1* | 3/2020 | Hsieh ..................... H01Q 21/30 |
| 2022/0068801 A1* | 3/2022 | Kao ........................ H01L 24/14 |

FOREIGN PATENT DOCUMENTS

| | | |
|---|---|---|
| JP | 2013-026633 A | 2/2013 |
| JP | 2016-0509375 A | 3/2016 |
| JP | 2020-136673 A | 8/2020 |
| KR | 10-2018-0024099 A | 3/2018 |
| KR | 10-2018-0026763 A | 3/2018 |
| KR | 10-2018-0089302 A | 8/2018 |
| WO | WO 2007/061216 A1 | 5/2007 |
| WO | WO 2012/117872 A1 | 9/2012 |
| WO | WO 2014/069107 A1 | 5/2014 |
| WO | WO 2014/130928 A2 | 8/2014 |

OTHER PUBLICATIONS

International Search Report for International Application No. PCT/GB2021/053034, mailed Feb. 9, 2022.
Written Opinion for International Application No. PCT/GB2021/053034, mailed Feb. 9, 2022.
Combined Search and Examination Report Under Sections 17 and 18(3) for corresponding Great Britain Application No. 2018551.8, mailed Aug. 20, 2021.
Examination Report Under Section 18(3) for corresponding Great Britain Application No. 2018551.8, mailed Feb. 20, 2023.
International Preliminary Report on Patentability for International Application No. PCT/GB2021/053034, mailed Jun. 8, 2023.
Office Action (Including Translation) for corresponding Japanese Patent Application No. 2023-532665, mailed Jul. 29, 2025.
Notification of Reasons for Rejection (Including Translation) for corresponding Korean Patent Application No. 10-2023-7021115, mailed Jul. 14, 2025.

* cited by examiner

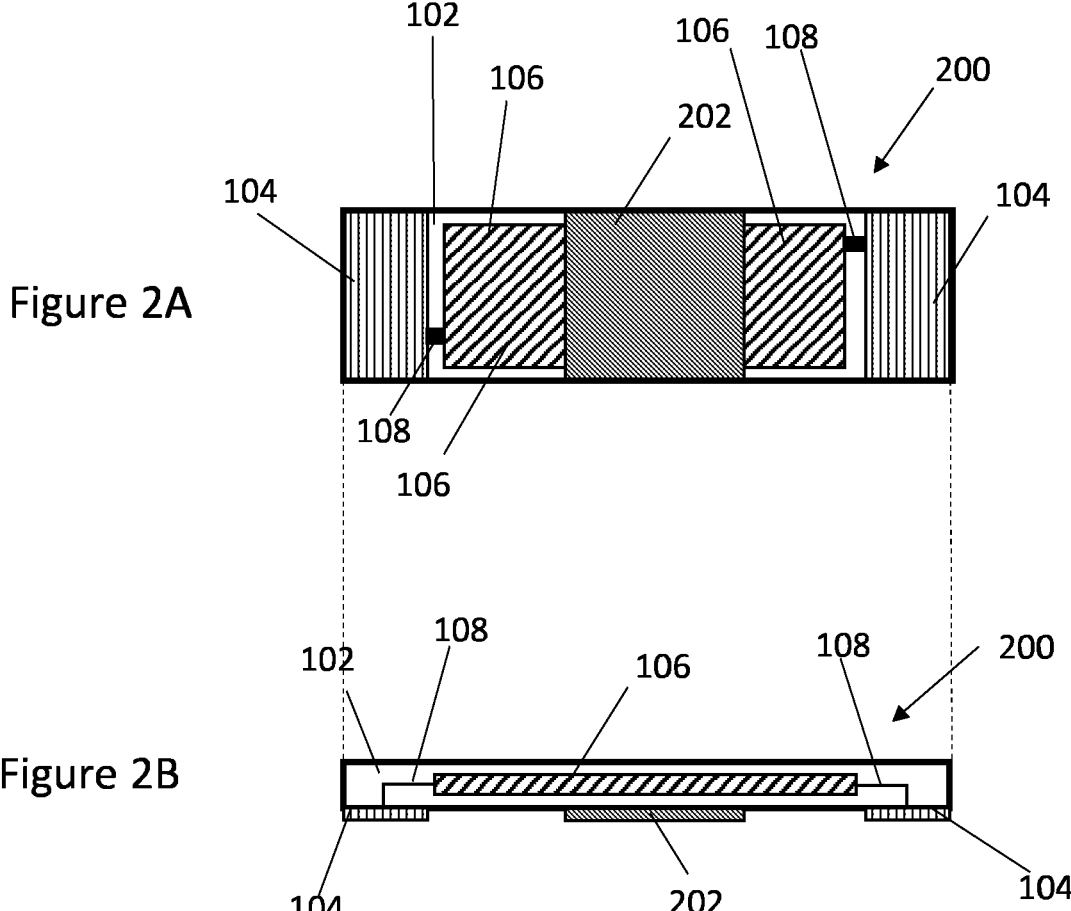
Figure 2A
Figure 2B
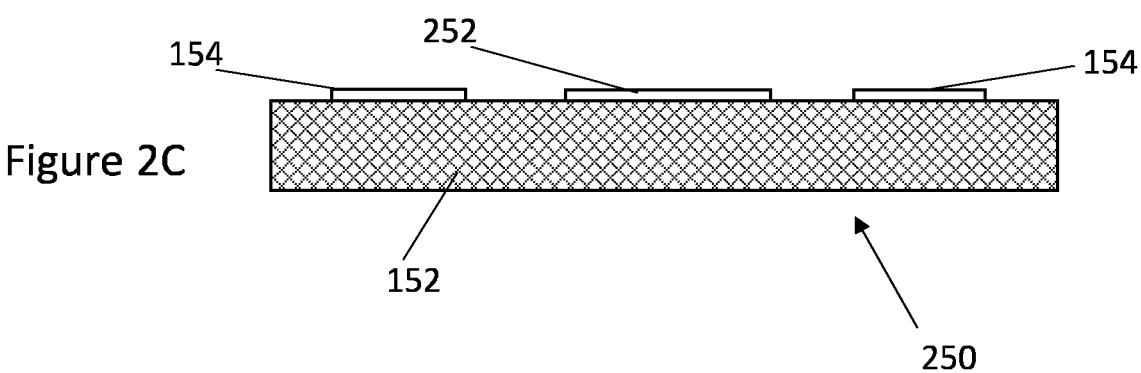
Figure 2C

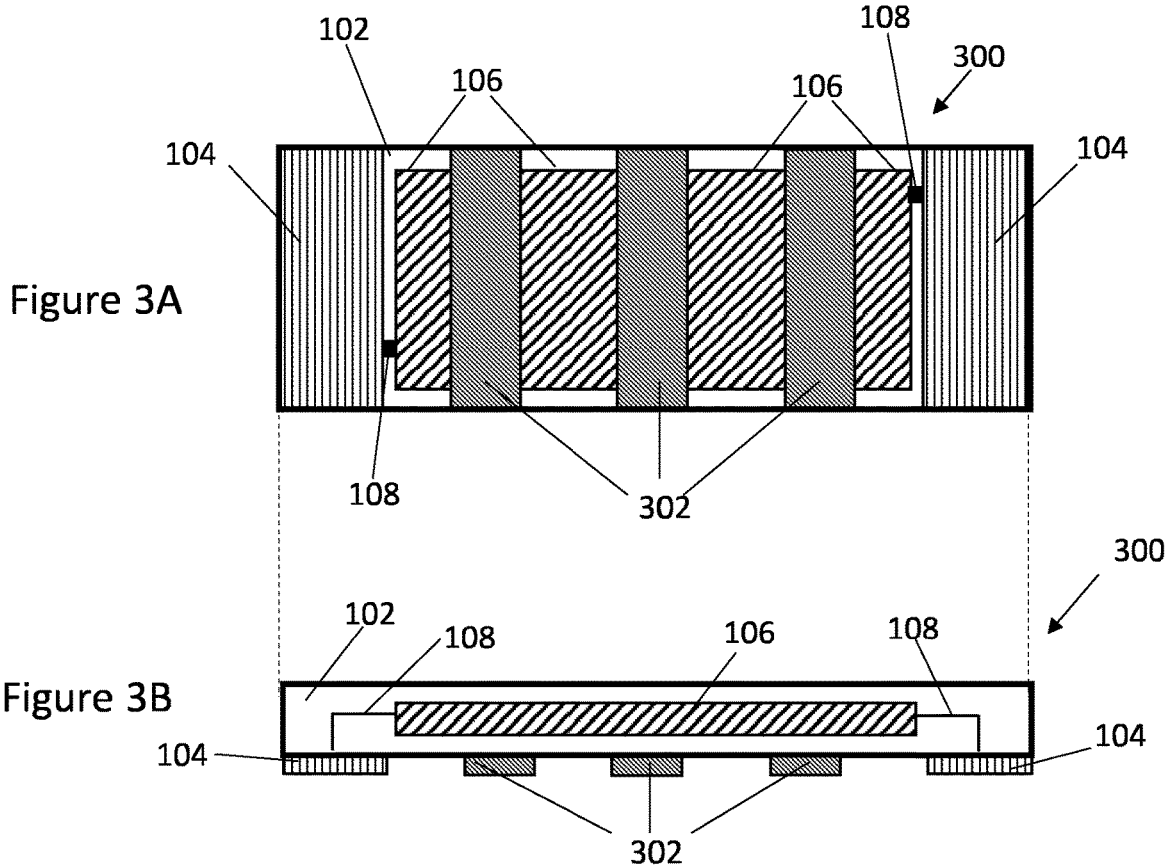
Figure 3A
Figure 3B
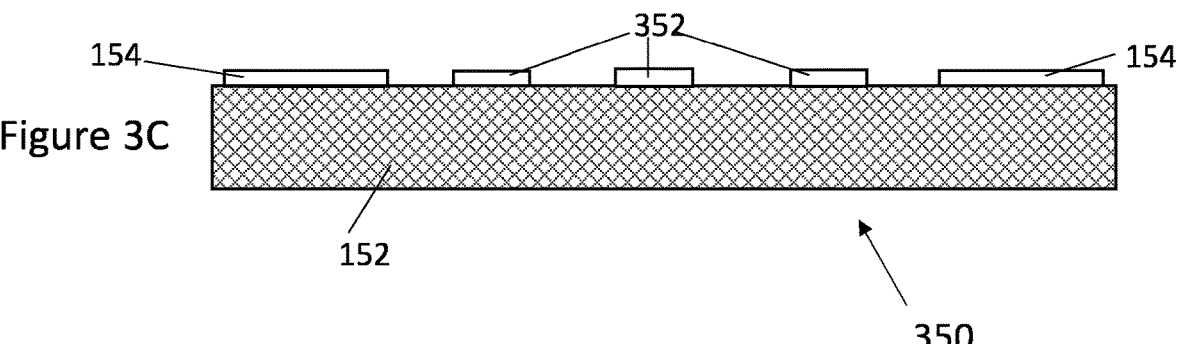
Figure 3C

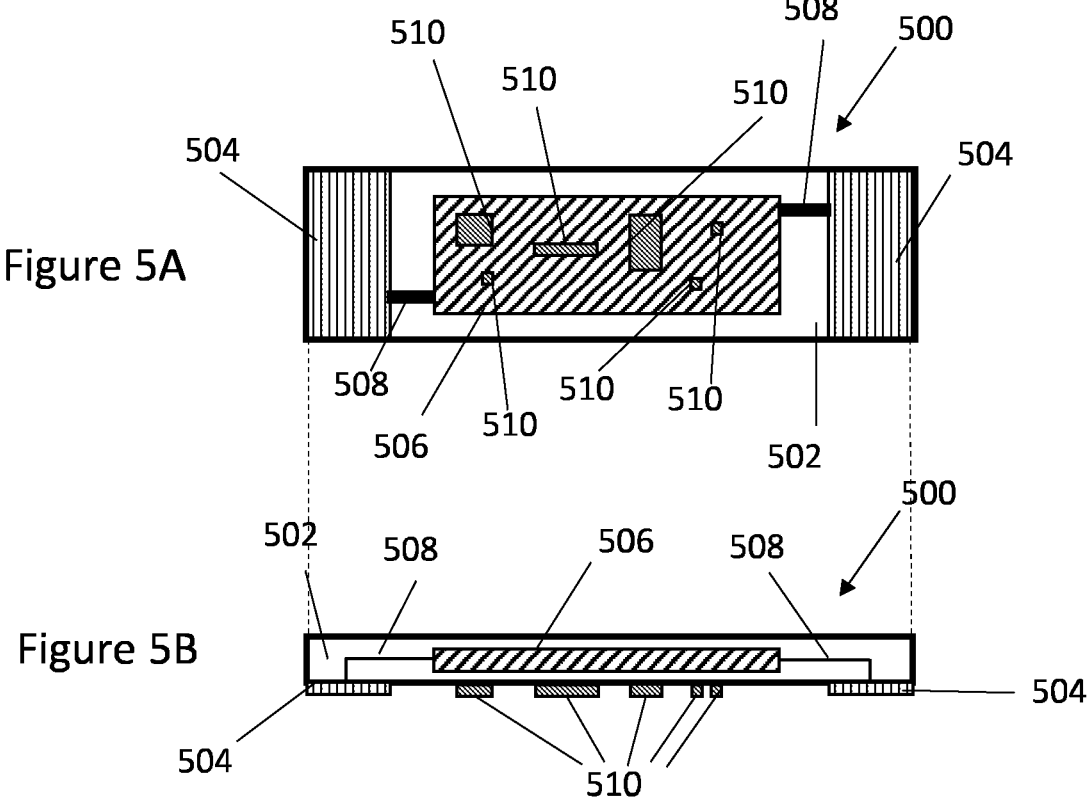
Figure 5A
Figure 5B
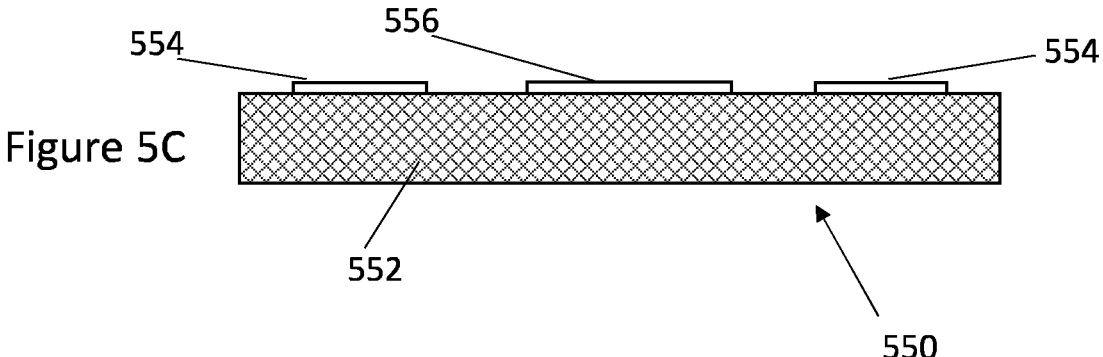
Figure 5C

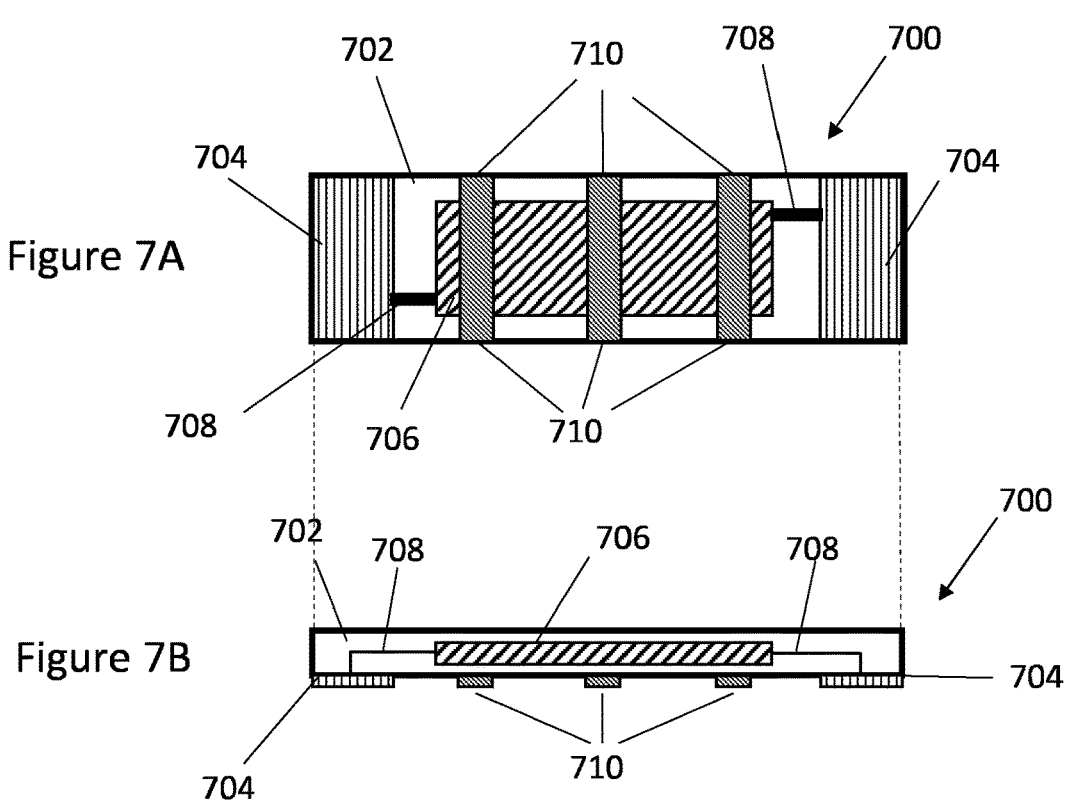
Figure 7A
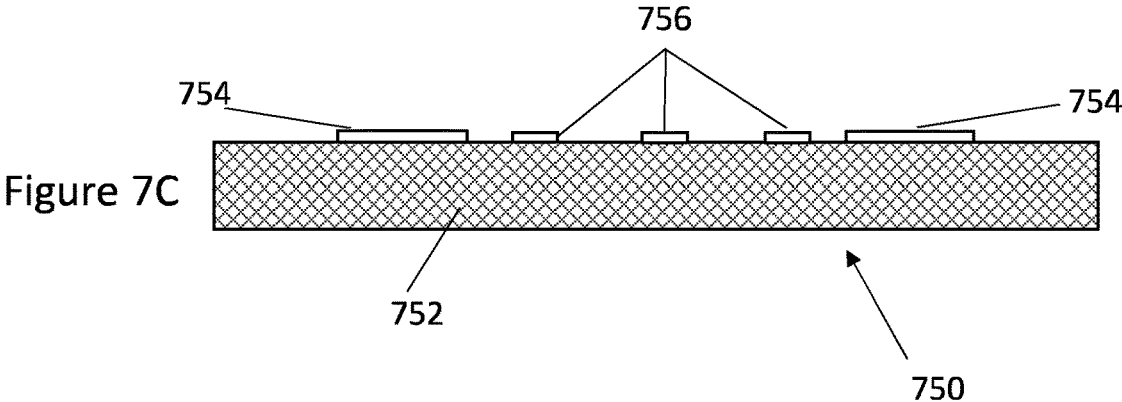
Figure 7B
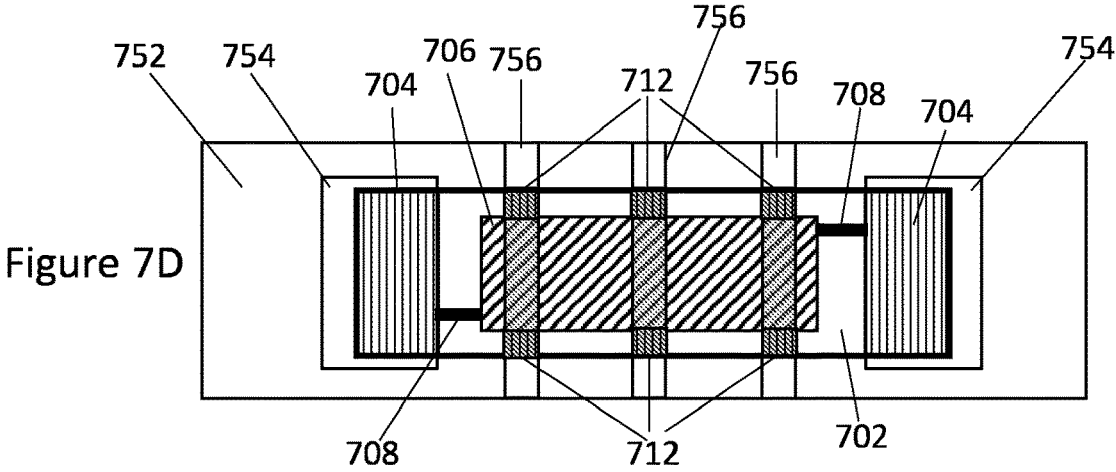
Figure 7C
Figure 7D

FLEXIBLE ELECTRONIC CIRCUITS WITH SUPPORT STRUCTURES

CROSS-REFERENCE TO RELATED APPLICATIONS

This application is a national stage application under 35 U.S.C. 371 of PCT Application No. PCT/GB2021/053034 having an international filing date of 24 Nov. 2021, which designated the United States, which PCT application claimed the benefit of Great Britain Application No. 2018551.8, filed 25 Nov. 2020, each of which are incorporated herein by reference in their entirety.

The present invention relates to support structures for flexible electronic circuits, and in particular, approaches for reducing damage to circuitry of flexible electronic structures due to the transmission of forces to the circuitry via support structures.

BACKGROUND

In the past decade, flexible circuitry has been branching out significantly from its initial role as a simple wire replacement to providing very cost-effective, but more complex interconnects, as well as, low-cost flexible integrated circuits (ICs) that can easily be embedded into everyday objects.

A flexible circuit structure, such as, for example, a flexible integrated or printed circuit (i.e. IC), is a patterned arrangement of circuitry and components that utilises flexible base material with or without flexible over lay. In particular, the flexible circuit structure (e.g. flexible IC or thin-film IC) may be formed in a thin layer of soft polymer film so that the flexible circuit structure can be bent or even stretched while maintaining integrity and functionality of the integrated circuit. Also, in contrast to a rigid silicon wafer IC, flexible circuit structures have usually no further protection, such as a hard, outer plastic case, and may therefore be vulnerable to damage.

According to a conventional method, ICs, whether rigid or flexible, are attached to substrates using conductive adhesives, such as anisotropic conductive adhesive (ACA, an example of which is an anisotropic conductive paste (ACP)). ACA consists of an adhesive organic binder with a filling material of conductive particles forming a paste. An alternative approach is to sinter conductive metallic inks to simultaneously form solid metal and join the IC to the substrate, where this is known as intermetallic bonding. Recently, a copper nanoink has been used for such a die attach purpose.

With regards to the first bonding method mentioned above, the adhesive (e.g., ACA) is placed between a flexible circuit structure and respective contacts of an application circuit. A bonding tool (e.g., thermodes) is then used to press (while applying heat) the conductive particles into respective contacts, or bonding pads, of the flexible circuit structure and the application circuit forming an electrically conductive interface between the flexible circuit structure and the application circuit. Since the conductive particles are isolated within the non-conductive adhesive matrix, no lateral conduction takes place. The binder cures thermally to secure the bond between the flexible circuit structure and the application circuit.

However, conventionally there may be a relatively wide space between the contacts of the flexible circuit structure. A consequence of this is that, as a result of the bonding process, the flexible circuit structure may become distorted in an undesirable manner. For example, the flexible circuit structure may adopt a less controlled form, such as being less planar and/or less closely conforming to the shape of the external application circuit (or a substrate/structure comprising the external application circuit, which may itself be flexible). In some cases, this could result in damage to the flexible circuit structure.

FIGS. 1A, 1B and 1C illustrate a conventional structure and bonding process, where a flexible electronic structure 100 (such as a flexible IC) is bonded to an external structure 150 (such as an application circuit, external circuit, or an external structure including an application circuit or circuitry).

Referring to FIG. 1A, which is a view of the underside or first surface of the flexible electronic structure 100, the flexible electronic structure 100 includes a flexible body 102, and contact elements 104 (which it will be appreciated could also be referred to as contacts, bond pads, contact members etc.), where the contact elements 104 may be formed as part of a redistributive layer (RDL) and are intended to be bonded to the external structure in order to form an electrical connection. The flexible electronic structure 100 includes one or more integrated electronic components 106, which may also be referred to as circuitry of the flexible electronic structure, where these are electrically connected to the contact elements 104 through connections 108. Although the circuitry 106 and connections 108 are shown as being on the surface of the flexible electronic structure 100, this is for illustrating their arrangement and these features may be internal (i.e. embedded) in the flexible body 102 as shown in FIG. 1B.

The circuitry 106, which may comprise any of resistors, capacitors, transistors, diodes, inductors, etc., is embedded within the flexible body 102, and are operatively coupled to the contact elements 104 through the connections 108. In a case where there are more than two contact elements, the embedded circuit may be operatively coupled to at least two of the contact elements.

Referring to FIG. 1B, cross sections of the flexible electronic structure 100 and the external circuit 150 during the bonding process are shown. Referring to the above, it will be appreciated that an ACA may be provided between the flexible electronic structure 100 and the external structure 150.

External structure 150 includes a substrate 152 and external contact elements 154. The external contact elements 154 are provided on a first surface of the substrate 152 which opposes the first surface of the flexible electronic structure 100. The external contact elements 154 are provided to correspond to the contact elements 104 of the flexible electronic structure 100 so that once bonded they form an electrical connection between the two structures.

As shown in FIG. 1B, upon suitably positioning the flexible electronic structure 100 and the external structure 150 to ensure appropriate alignment of the contact elements 104 and the external contact elements 154, pressure is applied to a second surface of the flexible electronic structure 100, opposite to the first surface, and pressure is applied to a second surface of the external structure 150, opposite to the first surface, thereby pressing the flexible electronic structure 100 and the external structure 150 together through the ACA (not shown). The applied pressure is illustrated by the arrows 110. In addition to the applied pressure, one or more of the flexible electronic structure 100, the external structure 150 and the ACA may be heated. This results in the bonding and electrical connection between the contact elements 104 and the external contact elements 154.

FIG. 10 illustrates the problem which is discussed above, in that the flexible electronic structure 100 has deformed, or lost planarity, as a result of the bonding process. This is turn may lead to undue stress being placed upon the flexible electronic structure and/or the circuitry/components/connections therein, potentially leading to damage of the flexible electronic structure 100 and the circuitry/components/connections therein, thus leading to yield loss. In particular, a relatively high level of stress may occur at the edges of the bond pads, where the distortions are potentially greatest.

BRIEF SUMMARY OF THE DISCLOSURE

It is an aim of certain examples of the present disclosure to address an issue of damage occurring to circuitry of flexible electronic structures due to the transmission of force to the circuitry via support structures during bonding of the flexible electronic structure with an external application circuit.

In accordance with an aspect of the present disclosure, a flexible electronic structure for bonding with an external circuit is provided, the flexible electronic structure comprising a flexible body having a first surface, the flexible body comprising at least one electronic component; at least one contact element configured to bond with the external circuit, the at least one contact element operatively coupled with the at least one electronic component and provided at the first surface of the flexible body, and arranged to operably interface with the external circuit after bonding, and at least one support element provided at the first surface of the flexible body, each support element including a contact area arranged to contact a first surface of an external structure comprising the external circuit or a corresponding surface element disposed on the first surface of the external structure, wherein the contact area of each of the at least one support element does not overlie one or more predetermined types of electronic component among the at least one electronic component or one or more predetermined types of element of the at least one electronic component.

Positioning the contact areas of the support elements away from areas that overlie particular types of components or constituent parts of components may allow forces that arise during the bonding of the flexible electronic structure to an external circuit or use of the flexible electronic structure to be directed away from components that are susceptible to damage from such forces, thus reducing the likelihood of components of the flexible electronic structure being damaged.

In an example of the present disclosure, the predetermined types of electronic component include at least one of transistors, diodes, resistors, inductors and capacitors.

In an example of the present disclosure, the predetermined types of element of the at least one electronic component includes a dielectric element.

A dielectric material or layer may be relatively weaker or more fragile than other layers or materials of the flexible electronic structure and thus more susceptible to damage. Therefore, reducing overlapping between the contact areas of support elements and such components/materials may reduce the likelihood of damage occurring.

In an example of the present disclosure, circuitry of the flexible electronic structure is configured such that the predetermined types of electronic component are provided in one or more predetermined areas of the flexible body, and the contact area of the at least one support element does not overlie the one or more predetermined areas.

Configuring the layout of the circuitry such that certain areas include components that are more susceptible to damage may allow for a greater degree of freedom to be provided for the placement of the support elements, since they may be placed anywhere outside the certain areas. In turn, this may enable forces that occur during bonding or use of the flexible electronic structure to be more evenly distributed across or directed towards predetermined areas of the flexible electronic structure.

In an example of the present disclosure, circuitry of the flexible electronic structure is configured such that the predetermined types of electronic component are provided outside of one or more predetermined areas of the flexible body, and the contact area of the at least one support element overlie the one or more predetermined areas.

By configuring the layout of the circuitry, specific areas of the flexible body can be allocated to contact areas of support elements, thus allowing for an element of optimisation of the support element positioning e.g. support elements are positioned and the circuitry then configured around them. In turn, this may enable forces that occur during bonding or use of the flexible electronic structure to be more evenly distributed across or directed towards predetermined areas of the flexible electronic structure.

In an example of the present disclosure, the one or more predetermined areas includes a plurality of predetermined areas, and the plurality of predetermined areas are substantially regularly spaced apart.

A regular spacing of the predetermined areas may enable the support elements to be distributed more evenly across the surface of the flexible electronic device, thus enabling forces that occur during bonding or use of the flexible electronic structure to be more evenly distributed across the flexible electronic structure.

In an example of the present disclosure, there is at least a minimum lateral separation between a footprint of the contact area of each support element and a footprint of each of the predetermined types of electronic component or each of the one or more predetermined types of element of the at least one electronic component.

Forces that occur during bonding or use may not only be confined to the footprint of the contact areas but also to areas surround the footprints. Consequently, by introducing an additional lateral separation, the likelihood of damage to components of the circuitry can be reduced.

In an example of the present disclosure, the contact area of each support element does not overlie any circuitry of the flexible electronic structure.

By ensuring that no circuitry underlies the contact areas, the likelihood of damage to components of the circuitry can be reduced.

In an example of the present disclosure, the at least one support element is provided at a periphery of the first surface of the flexible body.

Due to fabrication constraints, there may be little or no circuitry at the periphery of the flexible body, and therefore support structures may be positioned there without substantially increasing the likelihood of damage to the circuitry. Consequently, support structures may be provided in areas that do not substantially increase the likelihood of damage to the circuitry without specific configuration of the circuitry.

In an example of the present disclosure, the at least one support element is electrically isolated from the at least one electronic component of the flexible electronic structure.

Electrical isolation of the support elements reduces the likelihood of shorting occurring between components of the flexible electronic structure.

In an example of the present disclosure, at least one support element is configured to establish an electrical connection between two corresponding surface elements disposed on the first surface of the external structure when the flexible electronic structure is bonded to the external circuit.

By providing support elements in such a manner, electrical features on the external structure may be replaced with the support elements, thus reducing the need for surface structures on the external structure, which in turn may reduce forces transmitted to areas of the flexible electronic device during bonding and use arising from contact between the surface structures and the flexible electronic structure.

In an example of the present disclosure, substantially the entire area of an upper surface of one or more of the at least one support element is the contact area.

Increasing the area of the contact area may lead to a more even distribution of the forces across the flexible electronic structure.

In an example of the present disclosure, the at least one contact element and the at least one support element are formed in a redistributive layer, RDL, of the flexible electronic structure.

The support elements may be fabricated in an efficient manner by forming them along with the contact elements from the RDL layer.

In an example of the present disclosure, the at least one support element is for reducing deplanarisation of the flexible structure during bonding of the flexible electronic structure with the external circuit.

Deplanarisation of the flexible electronic device may lead to increased likelihood of damage to the circuitry, and thus reducing deplanarisation may mitigate this increase.

In an example of the present disclosure, the flexible electronic structure is a thin-film integrated circuit, IC, or a flexible IC.

In an example of the present disclosure, each support element is configured to bond with the first surface of an external structure or corresponding surface element via a conductive adhesive, curable fluid, or via sintered metallic ink.

Bonding support structures in this manner provides a relatively low-cost and adaptable bonding procedure that may be combined with bonding of the contact elements to the external contact elements.

In an example of the present disclosure, the interface with the external circuit is for the communication of signals to be transmitted by or received by an antenna of the external circuit.

This can provide an efficient and robust approach to the bonding of a flexible electronic structure to an external structure (e.g. an application circuit) including an antenna.

In an example of the present disclosure, the flexible electronic structure comprises a plurality of support elements, each arranged to contact and electrically connect to a corresponding surface element disposed on the surface of external structure, wherein each surface element is an antenna track.

By providing support elements in such a manner, parts of antenna windings on the external structure may be replaced with the support elements, thus reducing forces transmitted to areas of the flexible electronic device during bonding and use arising from contact between the antenna winding and the flexible electronic structure.

In an example of the present disclosure, the flexible electronic structure comprises a plurality of contact elements, wherein the at least one support element is provided between two contact elements of the plurality of contact elements.

Such an arrangement may allow for a more even distribution of forces across the flexible electronic device.

In an example of the present disclosure, the at least one support element is arranged to provide shielding to one or more of electro-magnetic interference and radiation, for one or more of the at least one electronic component.

In an example of the present disclosure, the at least one support element is thermally connected to the at least one electronic component.

In an example of the present disclosure, the at least one support element provides heat spreading or heat sinking for the at least one electronic component.

BRIEF DESCRIPTION OF THE DRAWINGS

Embodiments of the invention are further described hereinafter with reference to the accompanying drawings, in which:

FIGS. 2A, 2B and 2C show a schematic illustration of a flexible electronic structure having a support element.

FIGS. 3A, 3B and 3C show schematic illustrations of flexible electronic structures having support elements.

FIGS. 5A, 5B and 5C provide a schematic illustration of a flexible electronic structure having a support element according to an embodiment of the present disclosure.

FIGS. 7A, 7B, 7C and 7D show a schematic illustration of a flexible electronic structure having a support element according to an embodiment of the present disclosure.

DETAILED DESCRIPTION

The described example embodiment(s) relate(s) to flexible electronic structures, which may be or comprise integrated circuits (ICs). In particular, certain embodiments relate to flexible ICs or thin-film ICs suitable for assembly with an external application circuit or other external circuit structure.

Also, the term Integrated Circuit (IC) used in this disclosure may be interpreted very broadly, and the nature of ICs and other products described may be extremely diverse. Any item comprising an electronic component and exhibiting some electronic activity is in scope. ICs may include but are not limited to digital ICs, analogue ICs, mixed-signal ICs, microprocessors, digital signal processors (DSPs), logic ICs, microcontrollers, interface ICs, programmable logic devices, application-specific ICs (ASICs), RFID ICs, RF ICs, memory ICs, sensors, power management circuits, operational amplifiers, data acquisition ICs, clock/timing ICs etc., but also any suitable active and/or passive electronic components.

Furthermore, throughout the specification, the term "connected" is understood to mean a direct connection such as electrical, mechanical or magnetic connection between the things that are connected. The term "coupled" is understood to mean a direct or indirect connection (i.e. through one or more passive or active intermediary devices or components). Further, unless otherwise specified, the use of ordinal adjectives, such as, "first", "second", "third" etc. merely indicate that different instances of like objects are being referred to and are not intended to imply that the objects so described must be in a given sequence, either temporally, spatially, in ranking or in any other manner. Orientation terminology, such as, "horizontal" is understood with respect to a plane parallel to the conventional plane or surface of a wafer or substrate, regardless of the orientation of the wafer or substrate. The term "vertical" may refer to a direction perpendicular to the horizontal as defined previously. Prepositions, such as, "on", "side", "higher", "upper", "lower", "over", "bottom" and "under" may be understood with respect to the conventional plane or surface being on the top surface of the wafer or substrate, regardless of the orientation of the electrical interconnects or the electronic package.

Throughout the description and claims of this specification, the words "comprise" and "contain" and variations of them mean "including but not limited to", and they are not intended to (and do not) exclude other components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Figure 1A:
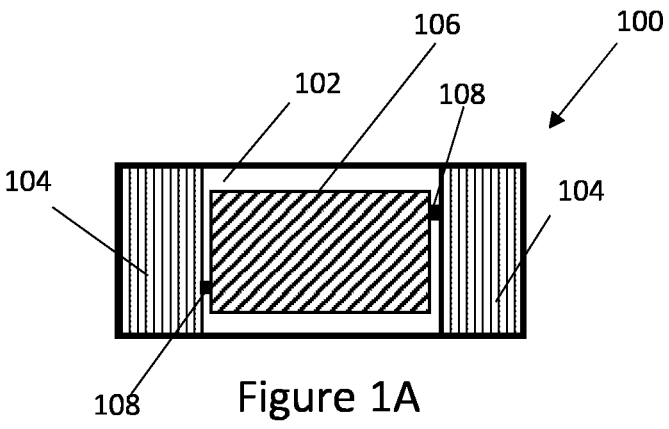
FIGS. 1A, 1B and 1C show a schematic illustration of a flexible electronic structure.

FIGS. 2A, 2B and 2C show schematic illustrations of a flexible electronic structure 200 and an external structure (i.e. application circuit) 250, where the flexible electronic structure 200 corresponds to that of FIG. 1A but includes an additional support structure or element 202, and the external structure 250 corresponds to that of FIG. 10 but with an additional surface structure or element 252, which may take the form of an electrical track, an electrical component, an isolating structure or any other form of protruding structure. The flexible electronic structure 200 may be a thin-film IC, however it is not limited to such as discussed above.

The contact elements 104 (or bond pads) are shown to be provided at opposing sides of the flexible electronic structure 100 and up to the edges of the flexible electronic structure 200. However, it will be appreciated that one or both of the contact elements 104 may be provided elsewhere on the surface of the flexible electronic structure 200. Furthermore, the contact elements 104 may have the same or different sizes and shapes as one another.

Figure 1B:
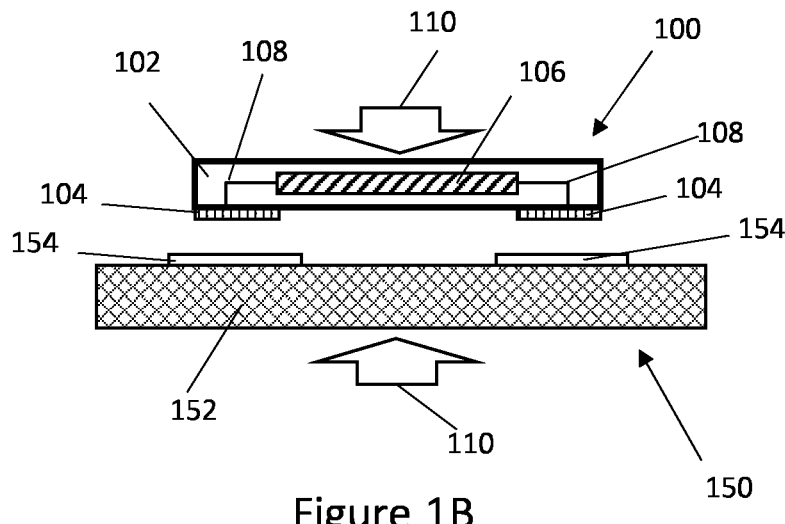
Figure 1C:
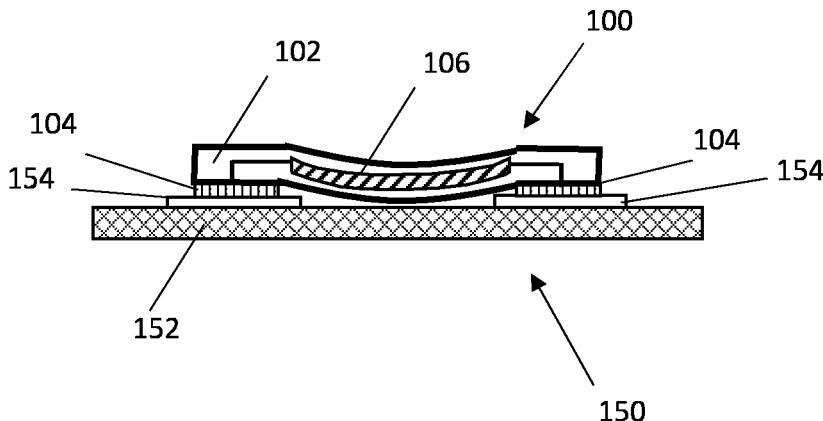

Referring to FIGS. 2A and 2B, the flexible electronic structure 200 has an additional structure, element or member 202 on the first surface, where this additional structure is intended to provide support to the flexible electronic structure 200 during and after the bonding process described with respect to FIGS. 1A, 1B and 1C. This support structure may be formed from the same layer as the contact elements 104 (e.g. the RDL layer) or may be formed separately and/or from a different material. According to certain examples, one or more of the contact elements 104, the support element 202, the external contact elements 104 and/or the external support element 252 may be formed of a conductive ink. These support elements may also be referred to as stand-off structures or features.

The external support element 252 (which may also be regarded simply as a surface element of the external structure 250) is provided on the external structure 250 to correspond to the support element 202 such that alignment of the contact elements 104 and the external contact elements 254 also results in substantial alignment of the support element 202 and the external support element 252.

The support element 202 is to mitigate, or prevent, unwanted deformation of the flexible electronic structure 200 resulting either from the bonding process or in use, as illustrated with respect to FIGS. 1A, 1B and 1C. For example, during the bonding process (for bonding the contact elements 104 to the external contact elements 154 or, more generally, for bonding the flexible electronic structure 200 to the external structure 250), the support element 202 may contact the external support element 252 and so provide support to the portion of the flexible electronic structure 200 on which the support element 202 is disposed. Furthermore, the support element 202 may bond to the corresponding external support element 252 via sintered metallic ink or a curable fluid combining conductive and adhesive properties (for example a conductive adhesive comprising conductive silver, copper, nickel or graphite particles suspended in an adhesive component comprising a varnish, silicone, synthetic resin or polyurethane), thereby providing further planarising support for the flexible electronic structure 200.

FIGS. 3A, 3B and 3C show schematic illustrations of a flexible electronic structure 300 and an external structure 350, where an alternative layout of support elements is provided compared to that described with reference to FIGS. 2A, 2B, and 2C. In particular, a plurality of support elements 302 are provided on the first surface of the flexible electronic structure 300 and corresponding external surface elements 352 are provided on the external structure 350. In some instances, the support elements 302 and/or the external surface elements 352 may corresponds to a particular component(s) of the external structure. For example. The external surface elements 352 may be the windings of an antenna, such that a single conductive support element 302 may lead to shorting of the antenna windings. However, the support elements 302 are intended to mitigate, or prevent, unwanted deformation of the flexible electronic structure 200 resulting either from the bonding process or in use in a similar manner to the support elements of FIGS. 2A and 2B. Although only two alternative support element layouts have been provided, the support elements may take a variety of forms depending on the function of the flexible electronic structure and the external structure, or a layer of structures on the external structure. The support elements may also be formed from any suitable material, where the choice of material may be dependent on fabrication requirements and/or whether the support elements are intended to have a secondary purpose which requires the support element to have certain properties.

For example, as well as mitigating deformation of the flexible electronic structure, support elements may also be provided and appropriately positioned in order to shield internal components of the flexible electronic structure from other sources of damage. For example, the support elements may be provided to shield the flexible electronic structures and its internal components from unwanted penetration by the conductive particles of an ACA during the bonding process, where the particles may be forced through the first surface of the flexible electronic structure and damage the internal components. The support elements may also act to shield the circuitry of the flexible electronic structure from damage from protrusions or sharp elements on the bonding surface of the external structure. For example, the antenna windings of FIG. 3C may have perforated edges resulting from their fabrication, which can penetrate the flexible body and damage the circuitry during bonding. Accordingly, a support element may be provided to shield the circuitry form such damage.

Support elements may also act to shield internal components from damage resulting from other sources apart from the bonding process. For example, the support structures may be arranged to shield internal components from electromagnetic radiation, heat or other potential external sources of damage.

The support elements may be formed in a layer (e.g. metal) provided on the first surface of the flexible electronic structure. The thickness of the layer used for the support element is chosen so as to provide sufficient structural protection against anticipated damage, such as may arise, for example, due to conductive particles in an ACA (which may be several µm in diameter) being pressed, during bonding, into the circuit component(s) of the flexible electronic structure, thus, potentially causing structural damage, short circuits, open circuits and/or other damage to the flexible electronic structure. Further, the thickness of the layer may be configured to project from the insulating first surface of the flexible electronic structure, so as to provide a "stand-off" distance between the first surface (e.g. the insulating layer of polymer or passivation) of the flexible electronic structure and the external structure, where this thickness may be dependent on the thickness of the external contact elements and surface structures of the external structure.

Although the support elements 202, 302 described with reference to FIGS. 2A-C and 3A-C may reduce the stress that occurs at certain locations in flexible electronic structures by assisting with the maintenance of a planar form, such as close to the contact pads where the distortions are potentially greatest in the flexible electronic structure during bonding and/or use, the forces associated with the bonding process and the stress may be inadvertently transferred or transmitted to other areas of the flexible electronic structure via the support element. This may also be the case for support elements that are intended to shield internal components of the flexible electronic structure from other sources of damage, since these may also transmit force from the bonding process to internal components of the flexible electronic structure. As well as during the bonding process, forces may result from other steps during manufacture or use. For example, the support elements may transmit forces applied by a pick and place head to internal components, or transmit forces that occur when the bonded external structure and flexible electronic structure is applied or attached to a further structure, which may be the case when the bonded structures form an RFID tag for example.

The transmitted forces may potentially cause damage to all types of components of the flexible electronic structure, including active, passive and interconnect components. However, some types of components or constituent elements of certain types of components may be more susceptible to damage than others due to having a more brittle or weaker structure. Furthermore, particular materials or fabrication layers within the flexible electronic structure may be more susceptible to force-based damage or stress. For example, a dielectric layer such as an oxide layer that may form the gate insulation of a thin-film transistor may be particularly susceptible to damage due to its brittle nature. Consequently, there is a need to mitigate the potential damage caused by the transmission of forces by support elements on flexible electronic structures arising from bonding and/or use of the flexible electronic structure once bonded.

In accordance with embodiments of the present disclosure, in order to mitigate the potential damage whilst still providing support for planarization or shielding purposes, support elements are provided on areas of the first surface of the flexible electronic structure that do not overlie one or more predetermined types of electronic component of the circuitry of the flexible electronic structure, in areas that do not overlie one or more predetermined types of element of the components of the circuitry, or in areas which do not overlie particular types of materials or fabrication layers. In other words, the footprints of the support elements do not overlap or do not substantially overlap predetermined elements of the circuitry of the flexible electronic structure. Although predetermined components/elements of the circuitry are referred to here, support elements may also be positioned to avoid particular areas of the flexible electronic structure.

The transmitted forces are likely to be higher where a support structure contacts a surface element of substrate of the external structure. Consequently, if a support member does not fully contact the external structure, in some examples only those areas of the support element that make contact with the external circuit (i.e. contact areas of the support elements) may be taken into account when positioning support elements or configuring circuitry such that predetermined components are not in high-stress areas i.e. under the contact area of the support elements.

Avoiding or reducing such overlapping may be achieved by selective positioning of the support elements and/or appropriate configuration of the layout of components or elements of the circuitry. By virtue of this approach, forces that may be transmitted via the support elements during bonding or use may be directed to areas of the flexible electronic structure away from components that may be more susceptible to damage, whilst still providing support against planarization and/or component shielding. In turn this means that there will be a reduced chance of internal components of the flexible electronic device being damaged, thus leading to increased manufacturing yield and/or improvements in operational reliability.

Figures 4A, 4B, 4C:
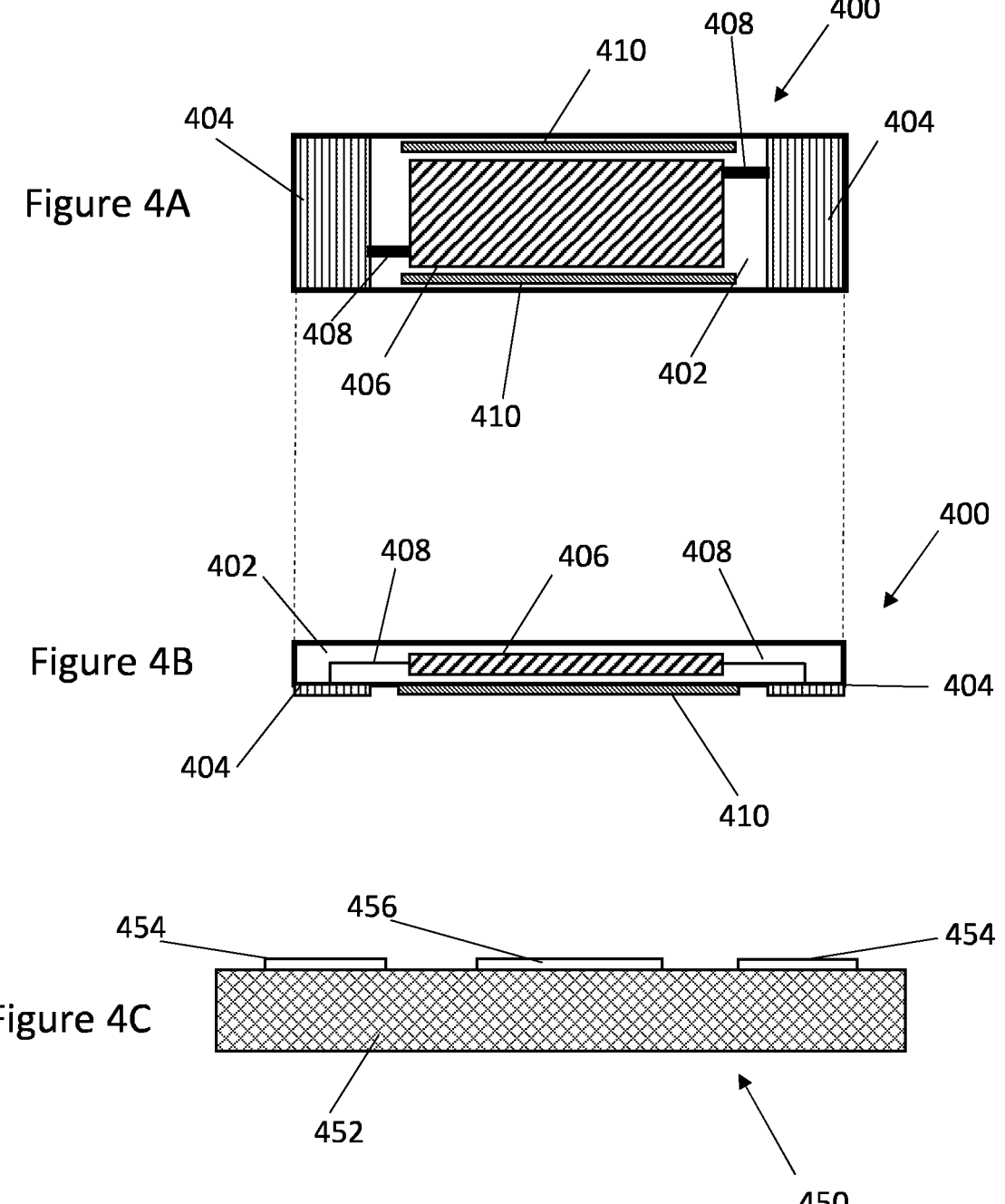
FIGS. 4A, 4B and 4C show a schematic illustration of a flexible electronic structure having a support element according to an embodiment of the present disclosure.

FIGS. 4A, 4B, and 4C provide a schematic illustration of a flexible electronic structure 400 in accordance with a first embodiment of the present disclosure. The flexible body 402, contact elements 404, circuitry 406 and connections 408 are similar to those described with reference to FIGS. 1, 2, and 3. However, support elements 410 are provided on the first surface of the flexible electronic structure 400 in areas that do not overlie one or more predetermined types of electronic component of the circuitry 406 and/or in areas that do not overlie or one or more predetermined types of element of the components or the circuitry 406 in general. The predetermined types of electronic components may include all electronic components of the flexible electronic structure or only certain types that are more susceptible to damage. For example, the predetermined types may include one or more transistors, diodes, capacitors, resistors, inductors, interconnects, microelectromechanical components, optical components, sensor components, and the predetermined elements of electronic components may include dielectric layers, semiconductor layers, or other relatively weaker elements.

Referring to FIG. 4A, the support elements 410 are positioned on the periphery of the first surface of the flexible electronic structure 400 so that they do not overlie the circuitry 406 beneath the first surface i.e. the footprint of the support element 410 does not vertically overlap the footprint of the circuitry 406. Although FIG. 4A illustrates the support elements 410 being positioned wholly outside of the area of the circuitry 406, in some examples there may be some overlap of more robust components, such as interconnects or resistors for example.

FIG. 4B show a cross section of the flexible electronic structure 400, and in conjunction with FIG. 4C illustrates the corresponding position of the support elements 410 and the surface element 456 of the external structure 450. The support elements 410 and the surface element 456 are positioned such that the support elements 410 and the surface element 456 will contact each other during bonding, thus reducing deplanarisation of the flexible electronic structure 400. The surface element 456 may take any suitable form that allows sufficient contact with the support elements 410 to provide sufficient deplanarisation. For example, the surface element 456 may be laterally larger than, equal to or smaller than the corresponding support elements 410, or may only partially overlap with the support elements 456. In other examples, the surface element 456 may cover substantially the whole first surface of the external structure 450 or may be absent and the support elements 410 may directly contact the first surface of the external structure 450. For instance, it may not be possible to provide appropriate surface elements that correspond to the positioning of the support elements 410. The substrate 452 and contact elements 454 of the external structure may be similar to those described with reference to FIGS. 1-3.

The arrangement of the support elements 410 in FIGS. 4A and 4B is based on the layout of the circuitry of the flexible electronic structure. In other words, the arrangement of the circuitry may not have been designed or optimised with the placement of the support elements in mind. The areas in which the support elements 410 may be placed may therefore arise from design or fabrication criteria of the circuitry. For example, components may be prohibited from certain areas by dice lane proximity or due to restrictions on the placement of components near to the edge of the flexible body 402. The lack of specific adaptation of the circuitry 406 for placement of the support elements may potentially lead to somewhat limited possible placements of the support elements. Although this may complicate one or more of the placement of the support elements 410, the shape of the support elements 410 and the placement/shape of corresponding surface structures 456 on the external structure 450, it may place fewer design criteria or restrictions on the circuitry, reducing any adverse effects that the use of support elements might have on design complexity or layout efficiency of the circuitry.

In FIGS. 4A and 4B, the support elements are shown to be continuous, but in some implementations they may be split into separate, electrically isolated elements so as to avoid shorting surface components or connections on the external structure. For example, if the support elements overlap antenna windings of the external structure, it may be necessary to introduce gaps into the support elements to avoid shorting across the antenna windings.

FIGS. 5A, 5B, and 5C provide a schematic illustration of a flexible electronic structure 500 in accordance with a second embodiment of the present disclosure. The flexible body 502, contact pads 504, circuitry 506, connections 508, external contact elements 554, and substrate 552 are similar to those described with reference to FIGS. 1, 2, and 3.

Referring to FIGS. 5A and 5B, the support elements 510 are positioned in areas of the first surface of the flexible electronic structure 400 that do not (or substantially do not) overlie predetermined types of components or component elements, such as those that may be adversely affected by forces transmitted during the bonding process. For example, the support elements 510 may be positioned in areas that fall between metal tracks, or above metal tracks but not lying at least a minimum lateral distance away from any TFTs, capacitors or resistors. However, the support element may be positioned to avoid all circuitry components regardless of the relative robustness. The support elements 510 may take any size or shape depending on the size and shape of the areas that do not include the relevant components or circuit elements. As for the first embodiment described with reference to FIGS. 4A-C, this approach to the positioning of the support elements places few or no additional design criteria on the circuitry of the flexible electronic structure as the support elements are placed around the relevant components. However, the distribution of the support elements across the circuitry may provide more distributed support compared to the placement of the first embodiment (i.e. not positioned only at the periphery of the circuitry), therefore potentially reducing the stress associated with each individual support element. In particular, the reduced lateral separation between the support elements may distribute the forces more evenly.

FIG. 5B shows a cross section of the flexible electronic structure 500, and in conjunction with FIG. 5C illustrates the corresponding position of the support elements 510 and the surface element 556 of the external structure 550, such that the support elements 510 and the surface element 556 will contact each other during bonding, thus reducing deplanarisation of the flexible electronic structure whilst reducing forces transmitted to certain areas and thus certain components of the circuitry of the flexible electronic structure. The surface element 556 may take any suitable form that allows sufficient contact with the support elements 510. For example, the surface elements 556 may be laterally larger than, equal to or smaller than the corresponding support elements 510, or may only partially overlap with the support elements 556. In other examples, the surface element 556 may cover substantially the whole first surface of the external structure or may be absent and the support elements 510 may directly contact the first surface of the external structure. The substrate 552 and contacts elements 554 of the external structure may be similar to those described with reference to FIGS. 1-3.

Figures 6A, 6B, 6C:
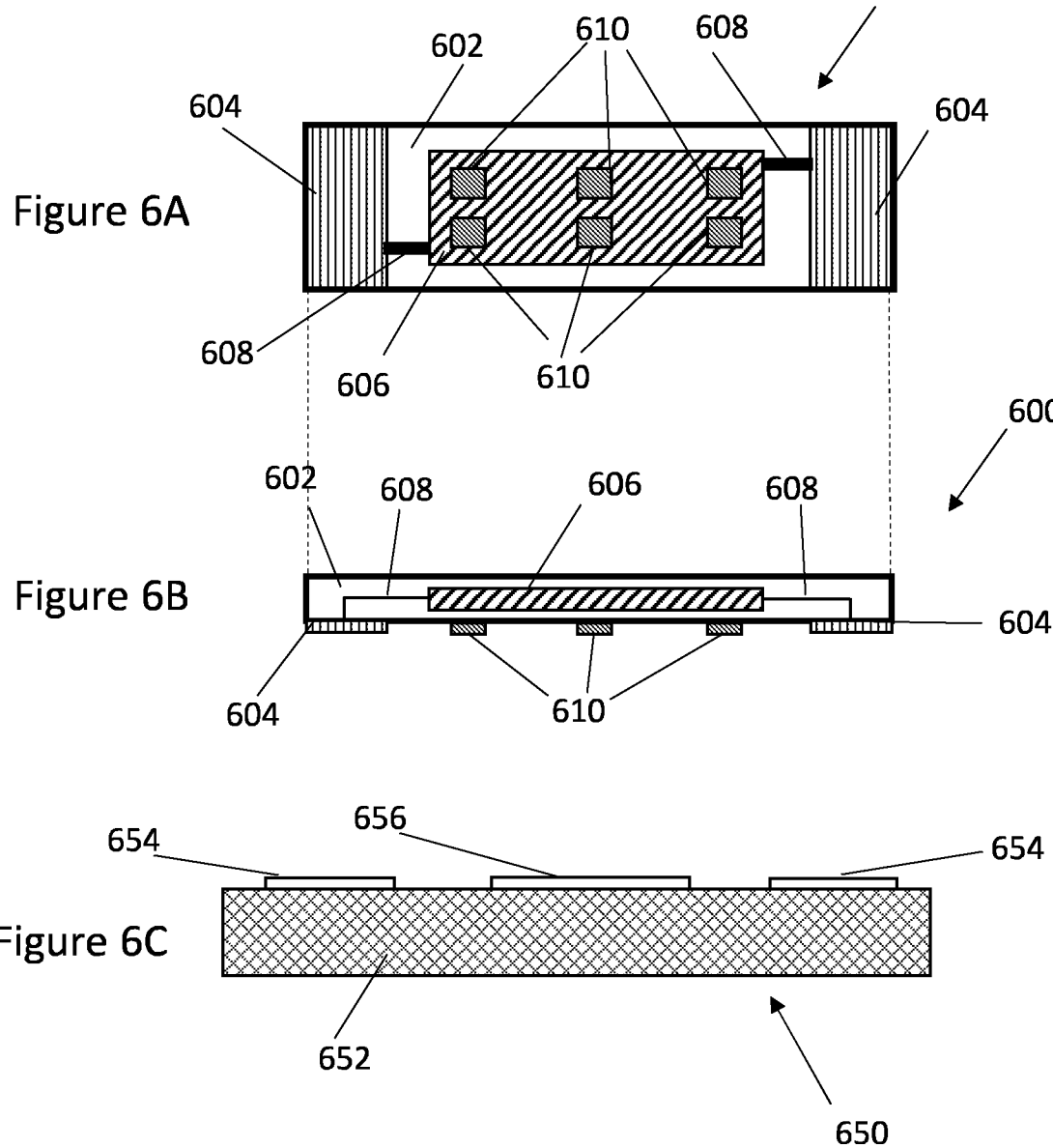
FIGS. 6A, 6B and 6C show a schematic illustration of a flexible electronic structure having a support element according to an embodiment of the present disclosure.

FIGS. 6A, 6B, and 6C provide a schematic illustration of a flexible electronic structure 600 in accordance with a third embodiment of the present disclosure. The flexible body 602, contact pads 604, circuitry 606, connections 608, external contact elements 654, and substrate 652 are similar to those described with reference to FIGS. 1, 2, and 3.

Referring to FIGS. 6A and 6B, in contrast to the approaches of the first and second embodiments in which few or no additional design criteria are placed on the configuration of the circuitry of the flexible electronic structure, the circuitry 606 is configured to provide one or more predetermined areas where components are not positioned, predetermined types of component are not positioned, or predetermined elements are not positioned. For example, windows in a dielectric layer may be provided for placement of the support elements 610 via patterning of the dielectric layer.

By virtue of this approach, additional control over the positioning of the support elements 610 is provided, which means that the positioning of the support elements may be optimised with respect to reducing stress on areas of the flexible electronic structure 600. For example, the support elements 610 may be evenly distributed across the area of the circuitry, thus providing more distributed support. The support elements 610 of FIGS. 6A and 6B are shown to be configured in a regular 3×2 pattern in the circuitry footprint; however, the support elements 650 may be distributed in any appropriate manner based on appropriate configuration of the circuitry such that the support may be provided wherever it is desired. Additionally, by introducing support element placement in to the design of the circuitry, account may also be taken of the positioning of surface structures 656 of the external structure, potentially providing bonding and planarisation.

A variation of the third embodiment is that, rather than configuring the design of the circuitry 606 so that components of a predetermined type are not positioned in one or more predetermined areas, the circuitry is configured such that predetermined types of components are provided only in certain areas, thus allowing the support elements to be positioned anywhere outside of the predetermined areas.

FIG. 6B shows a cross section of the flexible electronic structure 600, and in conjunction with FIG. 6C illustrates the corresponding position of the support elements 610 and the surface element 656 of the external structure 650, such that the support elements 610 and the surface element 656 will contact each other during bonding, thus reducing deplanarisation of the flexible electronic structure whilst reducing forces transmitted to certain areas and thus certain components of the circuitry of the flexible electronic structure. The surface element 656 may take any suitable form that allows sufficient contact with the support elements 610. For example, the surface elements 656 may be laterally larger then, equal to, or smaller than the corresponding support elements 610, or may only partially overlap with the support elements 610. Surface element 656 may comprise a single unbroken shape or it may comprise a number of elements separated from each other. In other examples, the surface element 656 may cover substantially the whole first surface of the external structure or may be absent and the support elements 610 may directly contact the first surface of the external structure. The substrate 652 and contact elements 654 of the external structure may be similar to those described with reference to FIGS. 1-3.

Although the approach of this third embodiment may lead to improved positioning of the support element and thus potentially improved mitigation of stress and damage to components of the flexible electronic structure, these benefits arise from introducing additional design restrictions on the circuitry 606. Consequently, the approach of this third embodiment may lead to more complex circuit design and/or increase the footprint of the circuitry due to the additional space required for the gaps in the circuitry and/or more complex circuit configuration (e.g. routing) to provide the gaps above which the support elements can be positioned.

FIGS. 7A, 7B, 7C and 7D provide a schematic illustration of a flexible electronic structure in accordance with a fourth embodiment of the present disclosure where the flexible electronic structure is to be attached to an external structure that comprises an antenna in a similar configuration to FIGS. 3A-C. The flexible body 702, contact pads 704, circuitry 706, connections 708, external contact elements 754, and substrate 752 are similar to those described with reference to FIGS. 1, 2, and 3.

Referring to FIGS. 7A, 7B and 7C, the surface elements 756 are windings of an antenna and the support elements 710 correspond to these windings. Therefore, if an arrangement of support elements 710 and surface elements 756 on the external structure 750 similar to FIG. 3 is utilised, it may be necessary to make significant design alterations to the circuitry 706 in order to place components susceptible to damage outside of the footprint of the support elements 710.

However, in accordance with the fourth embodiment, some of the parts of the antenna windings 756 that overlap the support elements are removed or not formed, and the support elements 710 used to ensure the continuity of the antenna windings, such that the antenna windings and support elements contact each other only at specific points (i.e. contact areas) along their length. Therefore, raised parts of antenna windings (or other conductor) on the surface of the external structure can be removed such that parts of the support elements do not have opposing raised structures, and forces applied during assembly and use are predominantly transmitted through the contact areas rather than along the entire length of the support elements. In turn this means that there are fewer restrictions on the placement of components in the circuitry since the restrictions are related to only the areas underlying the contact areas as opposed to the area underlying the whole of the support elements.

FIG. 7D provides a schematic illustration of the flexible electronic structure and external structure of FIGS. 7A, 7B and 7B once bonded. Although the support elements 710 span the width of the circuitry 706, force transmission predominantly occurs though contact areas 712 where the support elements meet the antenna windings/surface elements 756. As shown in FIG. 7D, these contact areas are positioned outside of the area of the circuitry, thus reducing force transmission to the circuitry. The bridging parts of the support elements i.e. the parts between the contact areas may be bonded to the surface of the external structure; however, given the differing separations between the contact areas and the non-contact areas and the external structure, the bonding forces will still be concentrated at the contact areas.

Although the fourth embodiment has been described with reference to the external structure including an antenna and the surface elements being windings of an antenna, the approach may be applied to any form of application circuit where the support elements of the flexible electronic structure may be used to carry a current, or connect to a voltage potential, of the application circuit, and the corresponding current path or potential plane on the surface of the application circuit may be removed.

In each of the first to fourth embodiments, areas where support elements may be placed are identified based on the layout of the circuitry of the flexible electronic structure and/or the circuitry is specifically configured to provide gaps where the support elements can be provided such that they do not overlie components susceptible to force/stress-based damage. However, in practice forces may not only be transmitted to areas of the flexible electronic structure that directly underlie the support elements but also the surrounding areas. Therefore, in accordance with a further embodiment of the present disclosure, a border area around a support member's footprint may be implemented such that circuitry, predetermined types of component, or predetermined elements on components are configured to be at least a minimum distance apart from the footprint of a support element.

Figure 8:
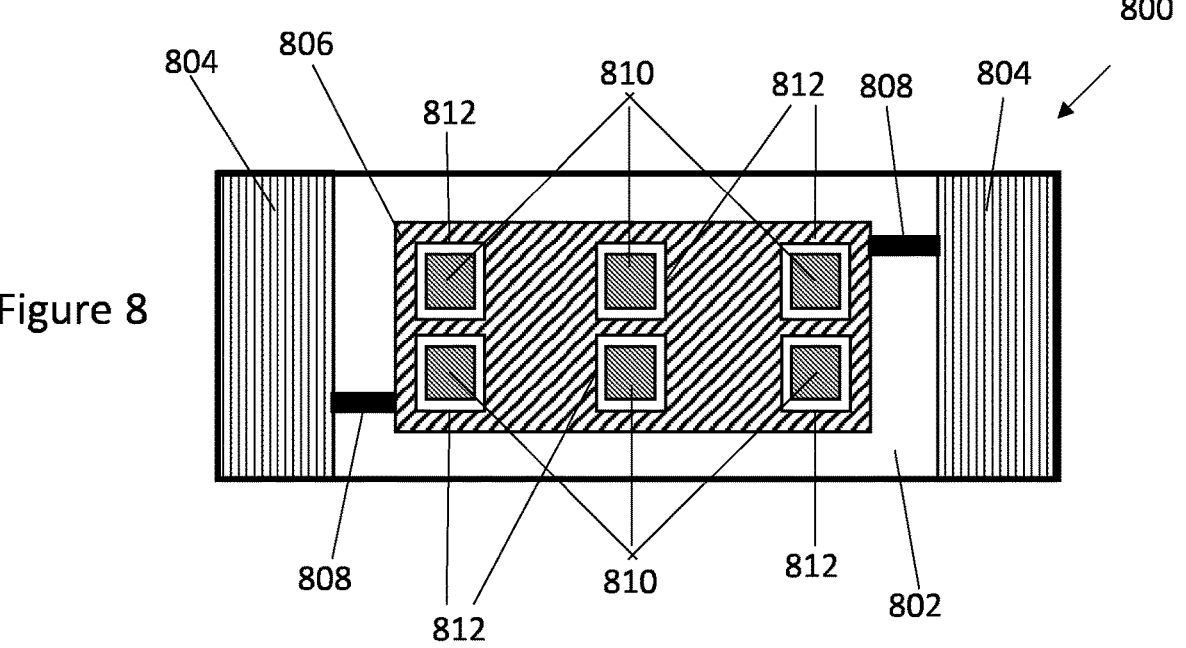
FIG. 8 shows a schematic illustration of a flexible electronic structure having a support element according to an embodiment of the present disclosure.

FIG. 8 provides a schematic diagram in accordance with this further embodiment. The flexible electronic structure 800 is similar to that of FIG. 6 but in addition to the area underneath the support elements 810 or the contact area of the support elements, a border or buffer area 812 is provided around each support element or contact area, under which restrictions are placed on the position of predetermined components or constituent elements thereof.

Although FIG. 8 relates to an implementation where the circuitry has been designed to ensure that the predetermined components do not lie under the support elements and their border areas, a similar approach may be applied to the techniques of the first and second embodiments. In particular, conditions may be implemented which require that support elements can only be placed where there is at least a minimum lateral distance to components susceptible to damage from transmitted forces. Although such an approach may further limit the area over which a support element can be positioned, reductions in transmitted force maybe achieved.

Features, integers, characteristics or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A flexible electronic structure for bonding with an external circuit, the flexible electronic structure comprising:
   a flexible body having a first surface, the flexible body comprising a plurality of internal electronic components;
   at least one contact element configured to bond with the external circuit, the at least one contact element operatively coupled with the plurality of internal electronic components and provided at the first surface of the flexible body, and arranged to operably interface with the external circuit after bonding; and
   at least one support element provided at the first surface of the flexible body, each support element including a contact area arranged to contact a first surface of an external structure comprising the external circuit or a corresponding surface element disposed on the first surface of the external structure,
   wherein the contact area of each of the at least one support element does not overlie one or more types of internal electronic component among the plurality of internal electronic components or one or more types of material of the plurality of internal electronic components, and
   wherein the flexible electronic structure is a thin-film integrated circuit (IC) or a flexible IC.

2. The flexible electronic structure of claim 1, wherein the types of internal electronic component include at least one of transistors, diodes, resistors, inductors and capacitors.

3. The flexible electronic structure of claim 1, wherein the types of material of the plurality of internal electronic components includes a dielectric material.

4. The flexible electronic structure of claim 1, wherein circuitry of the flexible electronic structure is configured such that the types of internal electronic component are provided in one or more areas of the flexible body, and the contact area of the at least one support element does not overlie the one or more areas.

5. The flexible electronic structure of claim 1, wherein circuitry of the flexible electronic structure is configured such that the types of internal electronic component are provided outside of one or more areas of the flexible body, and the contact area of the at least one support element overlies the one or more areas.

6. The flexible electronic structure of claim 5, wherein the one or more areas includes a plurality of areas, and the plurality of areas are substantially regularly spaced apart.

7. The flexible electronic structure of claim 1, wherein there is at least a minimum lateral separation between a footprint of the contact area of each support element and a footprint of each of the types of internal electronic component among the plurality of internal electronic components or each of the one or more types of element among the plurality of internal electronic components of the at least one electronic component.

8. The flexible electronic structure of claim 1, wherein the contact area of each support element does not overlie any circuitry of the flexible electronic structure.

9. The flexible electronic structure of claim 1, wherein the at least one support element is provided at a periphery of the first surface of the flexible body.

10. The flexible electronic structure of claim 1, wherein the at least one support element is electrically isolated from the at least one electronic component of the flexible electronic structure.

11. The flexible electronic structure of claim 1, wherein at least one support element is configured to establish an electrical connection between two corresponding surface elements disposed on the first surface of the external structure when the flexible electronic structure is bonded to the external circuit.

12. The flexible electronic structure of claim 1, wherein substantially the entire area of an upper surface of one or more of the at least one support element is the contact area.

13. The flexible electronic structure of claim 1, wherein the at least one contact element and the at least one support element are formed from a redistributive layer (RDL), of the flexible electronic structure.

14. The flexible electronic structure of claim 1, wherein the at least one support element is for reducing deplanarisation of the flexible electronic structure during bonding of the flexible electronic structure with the external circuit.

15. The flexible electronic structure of claim 1, wherein each support element is configured to bond with the first surface of the external structure or the corresponding surface element disposed on the first surface of the external structure via a conductive adhesive, a curable fluid, or via a sintered metallic ink.

16. The flexible electronic structure of claim 1, wherein the interface with the external circuit and the at least one contact element is for communication of signals to be transmitted by or received by an antenna.

17. The flexible electronic structure of claim 1, wherein the at least one support element comprises a plurality of support elements, each arranged to contact and electrically connected to a corresponding surface element disposed on the first surface of external structure, and wherein the electrical connection is for the communication of signals to be transmitted or received by an antenna.

18. The flexible electronic structure of claim 1, wherein the at least one contact element comprises a plurality of contact elements, wherein the at least one support element is provided between two contact elements of the plurality of contact elements.

19. The flexible electronic structure of claim 1, wherein the at least one support element is arranged to provide shielding to one or more of electro-magnetic interference and radiation, for one or more of the at least one electronic component.

20. The flexible electronic structure of claim 1, wherein the at least one support element is thermally connected to the at least one electronic component and arranged to provide heat spreading or heat sinking for the at least one electronic component.

* * * * *